(12) United States Patent
Shih et al.

(10) Patent No.: US 7,759,190 B2
(45) Date of Patent: Jul. 20, 2010

(54) MEMORY DEVICE AND FABRICATION METHOD THEREOF

(75) Inventors: Neng-Tai Shih, Taipei (TW); Jeng-Ping Lin, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 166 days.

(21) Appl. No.: 11/925,363

(22) Filed: Oct. 26, 2007

(65) Prior Publication Data

US 2008/0251829 A1    Oct. 16, 2008

(30) Foreign Application Priority Data

Apr. 13, 2007    (TW) .............................. 96113011 A

(51) Int. Cl.
*H01L 27/108* (2006.01)

(52) U.S. Cl. ...................... 438/245; 438/243; 257/304; 257/E21.647; 257/E21.652

(58) Field of Classification Search ................. 438/245, 438/243, 246; 257/304, E21.647, E27.084, 257/E21.652

See application file for complete search history.

(56) References Cited

U.S. PATENT DOCUMENTS

2004/0032027 A1*    2/2004    Popp et al. .................. 257/758

\* cited by examiner

*Primary Examiner*—Thomas L Dickey
*Assistant Examiner*—Fazli Erdem
(74) *Attorney, Agent, or Firm*—Quintero Law Office

(57) ABSTRACT

A fabrication method of a memory device is disclosed. A substrate having a trench is provided, comprising a trench capacitor, a conductive column, a collar dielectric layer and a top dielectric layer therein. A gate structure with spacers on sidewalls is disposed on the substrate and neighboring the trench. An opening is formed on the substrate between the collar dielectric layer and the gate structure. Next, a portion of the top dielectric layer and the collar dielectric layer is removed to expose a portion of the conductive column. An insulating layer is deposited on the gate structure and the exposed conductive column, filling the opening. The insulating layer is etched to expose a portion of the capacitor-side region of the substrate and the conductive column. A transmissive strap is formed by selective deposition, electrically connecting the capacitor-side region of the substrate and the conductive column.

16 Claims, 6 Drawing Sheets

MEMORY DEVICE AND FABRICATION METHOD THEREOF

BACKGROUND OF THE INVENTION

1. Field of the Invention

This invention generally relates to a memory device, and more particularly to a memory device having a single side buried strap.

2. Description of the Related Art

With the wide application of integrated circuits (ICs), several kinds of semiconductor devices with high efficiency and low cost are produced to meet different objectives. Dynamic random access memory (DRAM) is an important semiconductor device in the information and electronic industries. For achieving greater DRAM memory capacity and faster processing speed, deep trench capacitors are used.

Because conventional deep trench capacitors do not meet the requirements of a high density memory device, memory devices with single side buried straps have been developed to cope with the current problems. The fabrication process of such a memory device, however, is rather complex, and further encounters many issues below the 70 nm generation. For example, leakage, such as gate induced drain leakage (GIDL) or sub-threshold leakage, is a key issue in the memory device with single side buried straps below 70 nm generation.

BRIEF SUMMARY OF INVENTION

A detailed description is given in the following embodiments with reference to the accompanying drawings. These and other problems are generally solved or circumvented, and technical advantages are generally achieved, by the invention.

In an embodiment of a fabrication method of a memory device, a substrate comprising a trench is provided. A trench capacitor is disposed in a lower portion of the trench. A conductive column is disposed in the trench and electrically connects the trench capacitor. A collar dielectric layer surrounds a sidewall of the trench overlying the trench capacitor. A top dielectric layer is disposed on top of the trench. A gate structure is disposed on the substrate and neighboring the trench, wherein the substrate comprises a capacitor-side region and a bit line side region on opposite sides of the gate structure respectively. Spacers are disposed on sidewalls of the gate structure, one of which, adjacent to the trench, at least covers the capacitor-side region of the substrate. An opening is formed on the substrate between the collar dielectric layer and the gate structure. Next, a portion of the top dielectric layer and the collar dielectric layer is removed to expose a portion of the conductive column, and a portion of the spacer covering the capacitor-side region of the substrate. An insulating layer is deposited on the gate structure and the exposed conductive recess, filling the opening. Next, the insulating layer is etched to expose a portion of the capacitor-side region of the substrate and the conductive column. A transmissive strap is formed by selective deposition, electrically connecting the capacitor-side region of the substrate and the conductive column.

In another embodiment, a memory device is disclosed. A trench is in a substrate. A gate structure is disposed on the substrate and neighboring the trench. A trench capacitor comprising a top electrode is disposed in a lower portion of the trench. A conductive column is disposed in the trench, electrically connecting the top electrode of the trench capacitor. A collar dielectric layer surrounds a portion of a sidewall of the trench overlying the trench capacitor, wherein a portion of the collar dielectric layer neighboring the gate structure is thicker than other portions. An opening is in the substrate, and between the collar dielectric layer and the gate structure. An insulating layer covers a portion of the opening. A transmissive strap is formed in the opening and on the insulating layer, wherein the transmissive strap electrically connects a capacitor-side region of the substrate and the conductive column.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
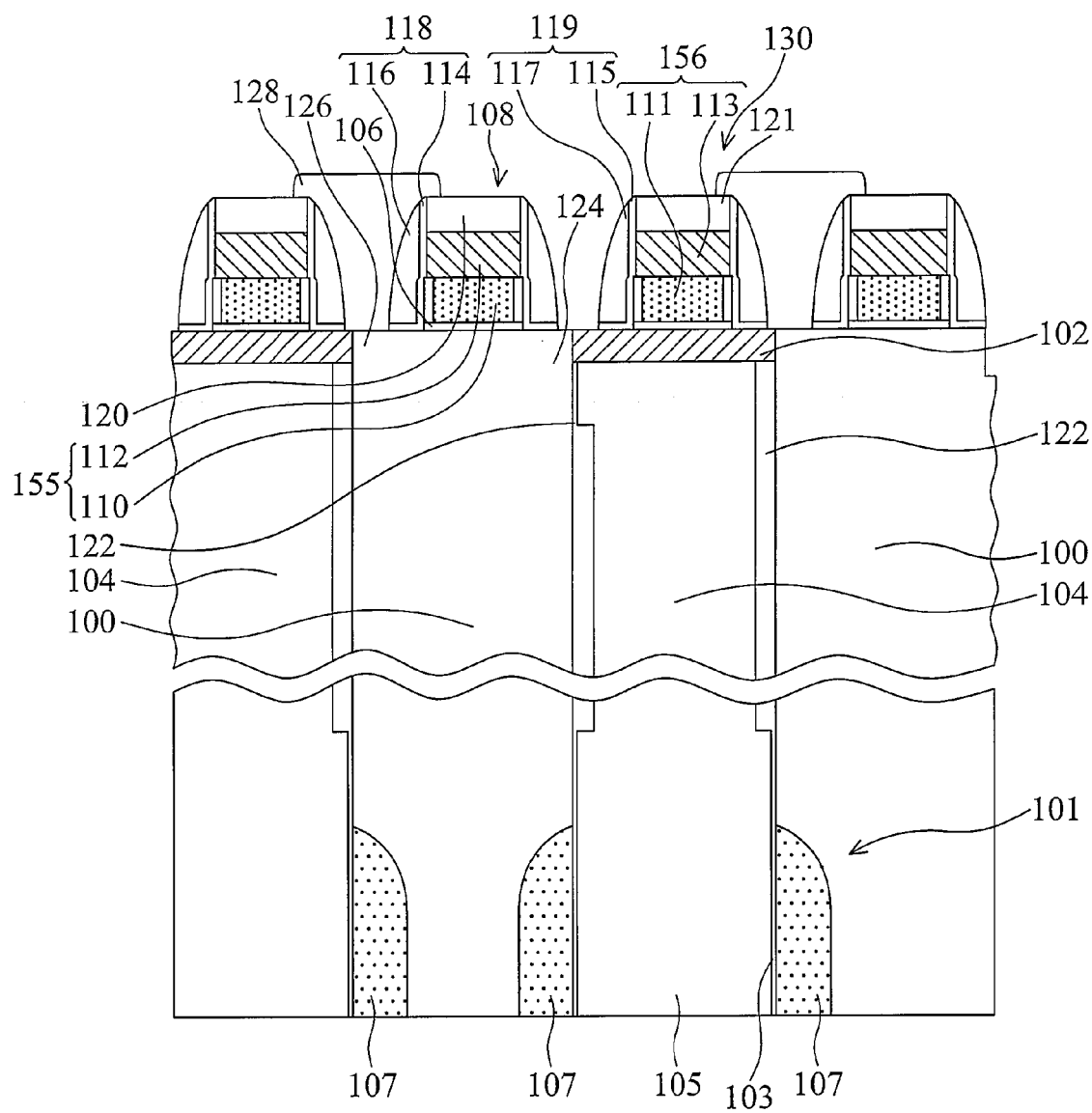
FIGS. 1A-1F illustrate fabrications of a memory device having a single side buried strap of an embodiment of the invention.

Embodiments of the invention are described with reference to the drawings that accompany the invention. It is noted that in the accompanying drawings, like and/or corresponding elements are referred to by like reference numerals. In this specification, expressions such as "on the substrate" simply denote a relative positional relationship with respect to the surface of the base layer, regardless of the existence of intermediate layers.

FIG. 1A~FIG. 1F illustrate fabrication of a memory device having a single side buried strap of an embodiment of the invention. FIG. 1A shows a cross section of a portion of a dynamic random access memory. Note that known process steps, such as implanting the substrate to adjust threshold voltage, forming a well region and forming a shallow trench isolation, are not illustrated for brevity and simplification.

A substrate 100, such as silicon, is provided. The substrate 100 is etched to form a deep trench, followed by forming a deep trench capacitor 101 in a lower portion of the deep trench. The deep trench capacitor 101 comprises a capacitor dielectric layer 103 on a sidewall of the lower portion of the deep trench, a top electrode 105 in the deep trench, and a bottom electrode 107 in the substrate 100 neighboring the lower portion of the deep trench. In addition, a collar dielectric layer 122 is formed on the sidewall of upper portion of the deep trench, surrounding a conductive column 104 electrically connecting the top electrode 105 of the deep trench capacitor 101, and a top dielectric layer 102 is on top of the conductive column 104. In the embodiment, the capacitor dielectric layer 103 comprises stacked layers of silicon oxide and silicon nitride, the top electrode 105 comprises polysilicon, the collar dielectric layer 122 and the top dielectric layer 102 comprise silicon oxide, and the conductive column 104 comprises polysilicon.

A gate structure 108 is formed on the substrate 100. In the embodiment, the gate structure 108 comprises a gate dielectric layer 106, a gate electrode 155 on top of the gate dielectric layer 106, a spacer 118 on a sidewall of the gate electrode 155, and a cap layer 120 on top of the gate electrode 155, wherein the gate electrode 155 comprises a polysilicon portion 110 and a metal portion 112, and the metal portion 112 comprises WSix to reduce resistance of the gate structure 108. The spacer 118 comprises a first layer 114, such as silicon nitride, and a second layer 116, such as silicon oxide. The cap layer 120 comprises silicon nitride. In an embodiment of the invention, a portion of the collar dielectric layer 122 neighboring the gate structure 108 is thinner than the other portions, wherein the thinner portion of the collar dielectric layer 122 has a thickness preferably about 10 Å-200 Å, and more preferably about 40 Å-100 Å.

When forming the gate structure 108, a passing gate structure 130 is also formed on the top dielectric layer 102 of the deep trench capacitor 101. The passing gate structure 130 also comprises a gate electrode 156, a cap layer 121 on top of the gate electrode 156 and a spacer 119 on a sidewall of the gate electrode 156. The gate electrode 156 comprises a polysilicon portion 111 and a metal portion 113. The spacer 119 comprises a first layer 115, such as silicon nitride, and a second layer 117, such as silicon oxide, wherein the first layer 115 of the spacer of the passing gate structure 130 covers a portion of the top dielectric layer 102.

The substrate 100 comprises a bit line-side region 126 and a capacitor-side region 124 opposite to the bit line-side region 126 with the gate structure 108 sandwiched therebetween. The capacitor-side region 124 is adjacent to the deep trench, and the bit line-side region 126 overlaps a bit line contact 128, such as polysilicon or tungsten.

Figure 1B:
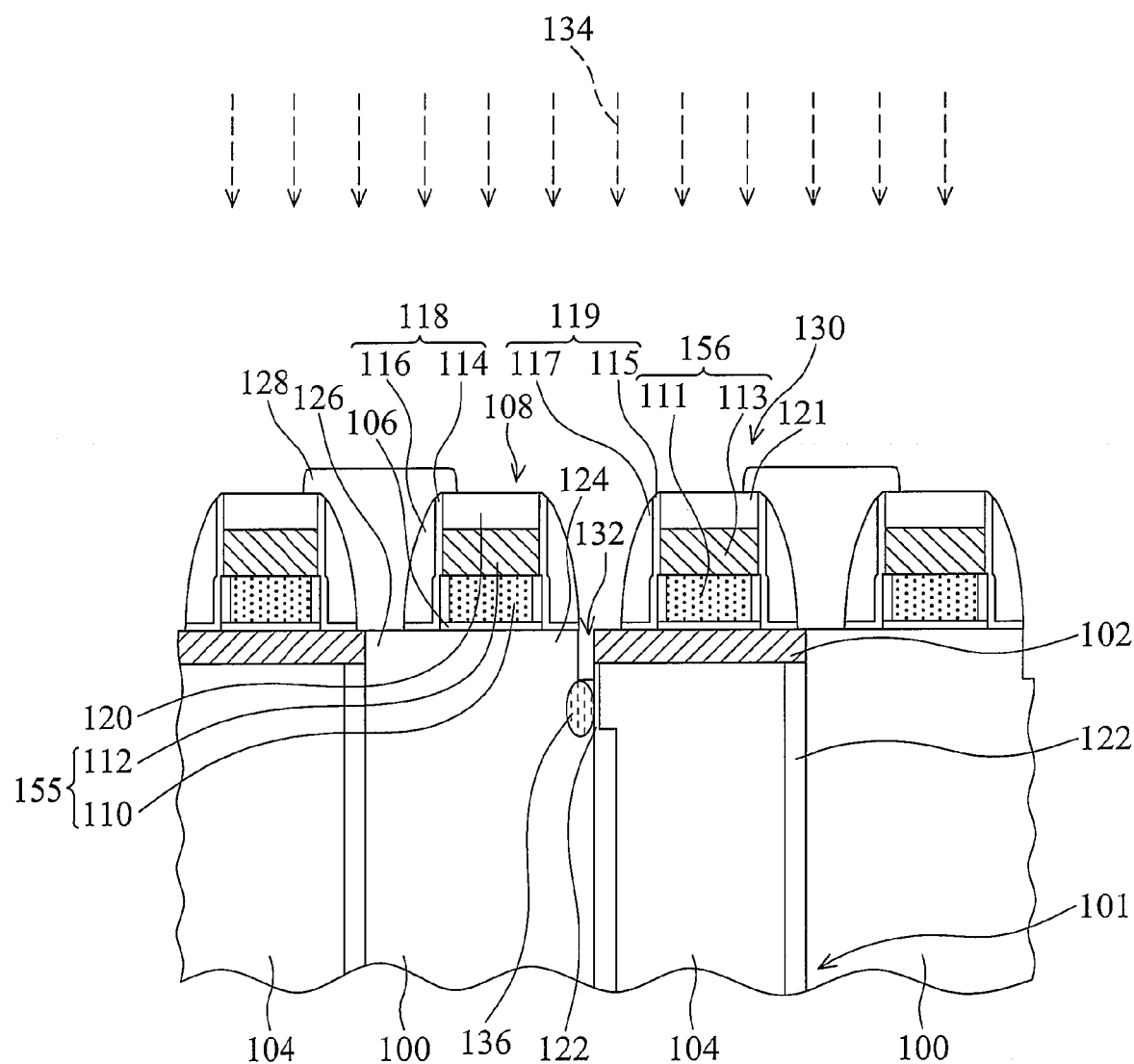

Referring to FIG. 1B, a selective etching is performed to remove a portion of the substrate 100 between the gate structure 108 and the trench capacitor 101, forming an opening 132. The selective etching herein should have high selectivity between the second layers 116 and 117 of the spacer 118 and 119 and the substrate 100, and between the top dielectric layer 102 and the substrate 100. The selective etching preferably uses halide, such as HBr or HCl as a main etchant, and HBr is more preferred. In an embodiment of the invention, bottom of the opening 132 is preferably lower than the top dielectric layer 102, but higher than bottom of the thin portion of the collar dielectric layer 122.

Next, an ion implanted process 134 is performed through the opening 132 to form a doped region 136 in a portion of the substrate bellow the opening 132 and neighboring the collar dielectric layer 122 to increase partial threshold voltage of a parasitical transistor. The ion implanting process 134 preferably uses boron dopants.

Figure 1C:
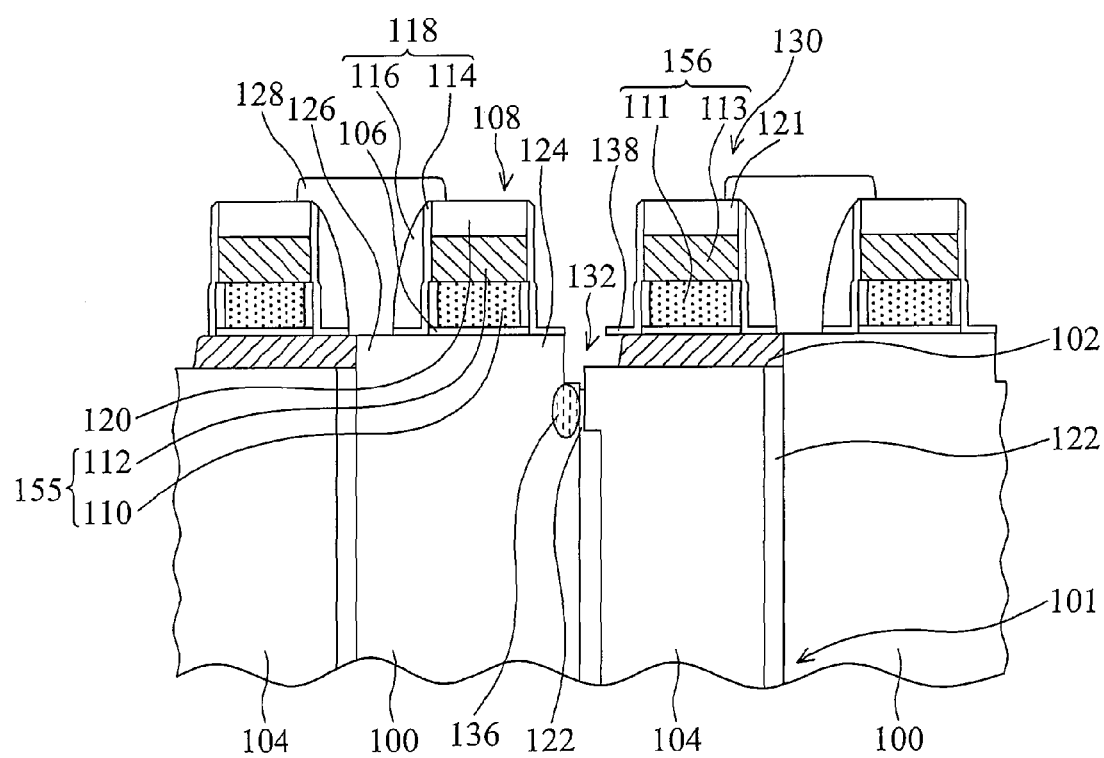

Referring to FIG. 1C, the top dielectric layer 102 and the collar dielectric layer 122 are etched to remove portions neighboring the gate structure 108 through the opening 132 by, for example, isotropic etching, wherein the isotropic etching may use HF as a main etchant. Since the second layers 116 and 117 of the spacers 118 and 119 have the same composition as the top dielectric layer 102 and the collar dielectric layer 122, they are removed simultaneously during the isotropic etching. Note that because a portion of the top dielectric layer 102 is selectively etched, a portion of the first layer 115 of the spacer 119 of the passing gate structure 130 floats, leaving a footing 138.

Figure 1D:
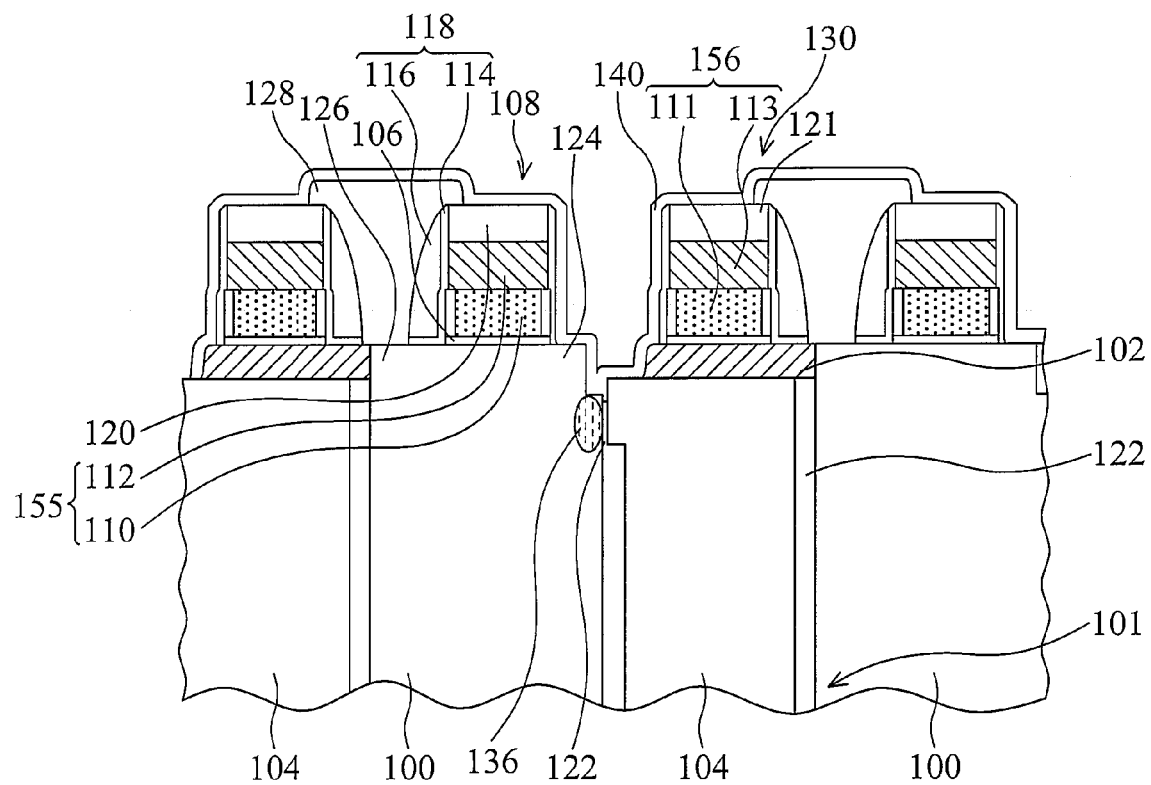

Referring to FIG. 1D, in order to fit process requirements, a portion of, or the entire footing 138 and the first layer 114 of the spacer 118 on the capacitor-side region 124 of the substrate 100 are removed by another isotropic etching process. Thus, the drain region 124 of the gate structure 108 is exposed and the unwanted footing 138 is removed. The anisotropic etching may be plasma etching, and preferably uses $CHF_3$, $CF_4$ mixed with $O_2$, $SF_6$ mixed with He or $C_2F_6$ as a main etchant.

Still referring to FIG. 1D, an insulating layer 140, such as silicon oxide, is blanketly deposited, covering the drain region 124 of the gate structure 108, the opening 132 between the deep trench capacitor 101 and the drain region 124, and the exposed conductive column 104 in the deep trench. The deposition process may be low pressure chemical vapor deposition (LPCVD), atmospheric pressure chemical vapor deposition (APCVD), plasma enhanced chemical vapor deposition (PECVD), atomic layer deposition (ALD), or the like deposition method, and preferably is a low temperature deposition method, such as PECVD.

Figure 1E:
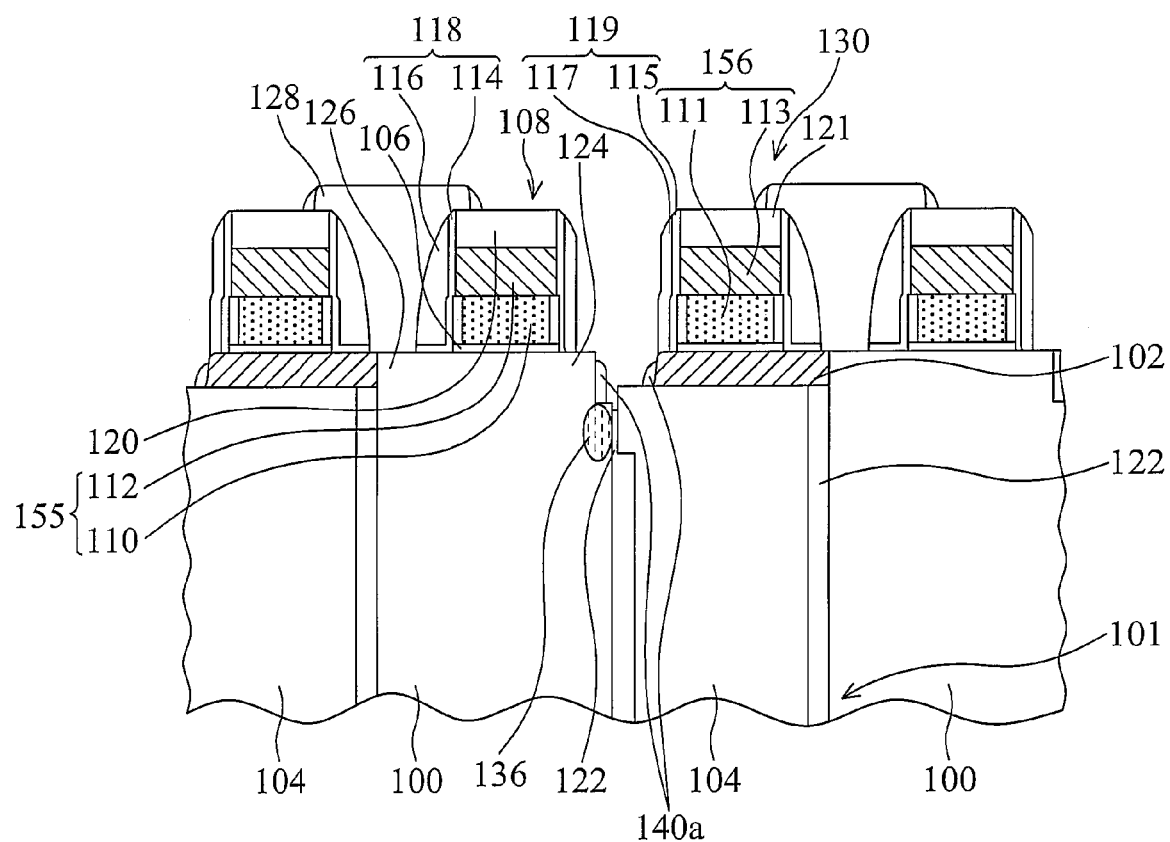

Next, referring to FIG. 1E, the insulating layer 140 is etched, using, for example, anisotropic etching, for providing connection in subsequent processes, in which the bottom portion of the insulating layer 140 is removed, leaving a sidewall portion 140a. The anisotropic etching preferably use $CHF_3$, $CF_4$ mixed with $O_2$, $CF_4$ mixed with $H_2$, $SiCl_4$, $C_2F_6$ or $C_3F_8$ as main etchant, and plasma may be used to enhance the etching.

Figure 1F:
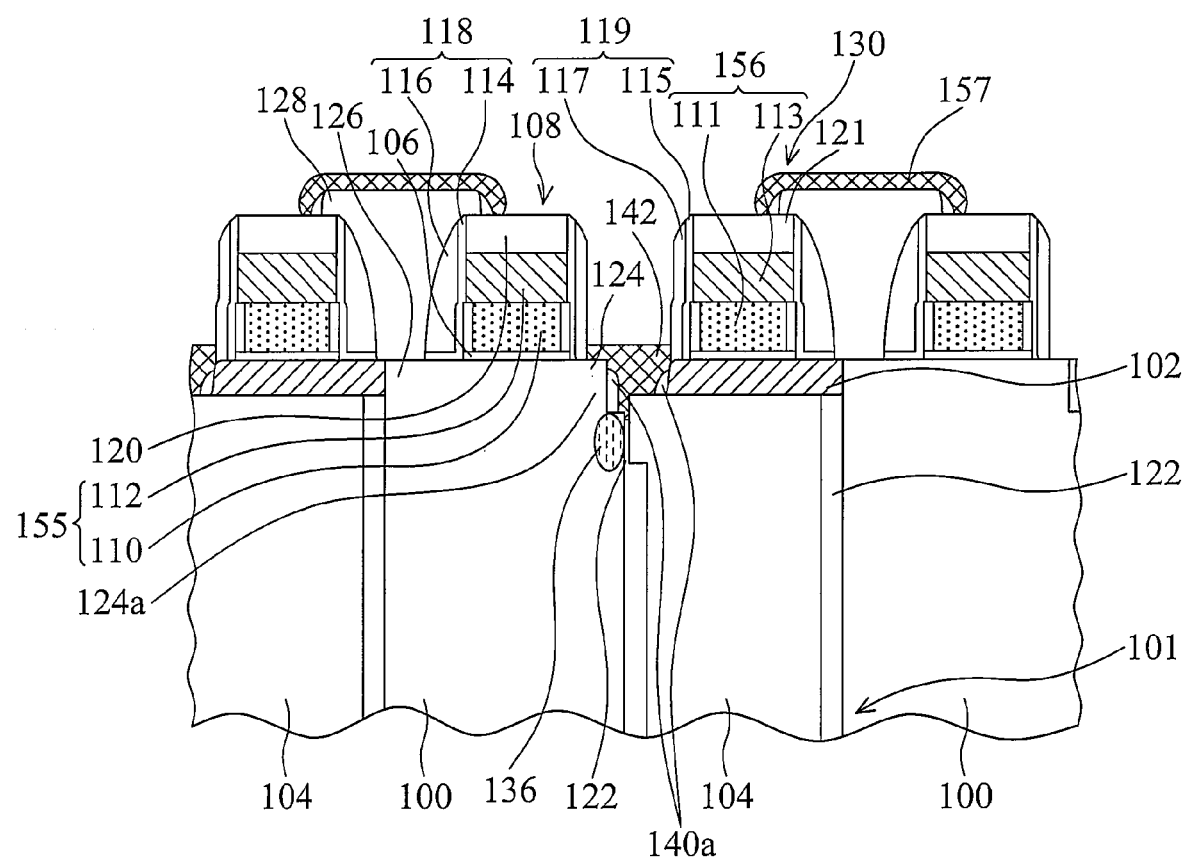

Referring to FIG. 1F, a transmissive strap 142 with low resistance is formed between the drain region 124 of the gate structure and the conductive column 104 of the deep trench capacitor 101 by selective deposition, such as selective epitaxial growth. The transmissive strap 142 preferably is an epitaxy layer formed by selective epitaxial growth, and preferably comprises Si or SiGe. In addition, the transmissive strap 142 preferably is selectively formed in the region between the drain region 124 of the gate structure 108 and the conductive column 104 of the deep trench capacitor 101. When the bit line contact 128 is polysilicon, another epitaxy layer 157 may also be formed thereon. The transmissive strap 142 can be doped to reduce resistance, and dopants in the transmissive strap 142 may diffuse into the drain region 124 in a subsequent thermal process.

According to the described embodiments, since a portion of the substrate outside the collar dielectric layer is ion implanted to form a doped region, the threshold voltage of a parasitic capacitor of the memory device can be decreased. The memory device can be designed to have a shorter collar length, thus increasing capacitance. In addition, because the transmissive strap is formed by selective epitaxial growth (SEG), it can be formed at a precise position, reducing gate induced drain leakage (GIDL). Further, because the transmissive strap is formed by selective epitaxial growth, the invention can reduce silicon loss of the strap region and provide low resistance. Additionally, the method of an embodiment of the invention can form asymmetric spacers, such as two spacers with different thicknesses at opposite sidewalls of the gate structure. For example, as shown in FIG. 1F, the spacers 118 on opposite sidewalls of the gate structure 108 have different thicknesses or compositions, wherein the spacer adjacent to the deep trench capacitor 101 is thicker than that adjacent to the gate structure 108. The asymmetric spacers, having different thicknesses or compositions, on opposite sides of the gate structure can optimize process integration and increase cell performance. In an embodiment, sub-threshold leakage from misalignment between a trench capacitor and a gate structure of the memory device can be reduced according to asymmetric spacers.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a memory device, the method comprising the steps of:

providing a substrate having a trench, wherein a trench capacitor is disposed in a lower portion of the trench, a conductive column is disposed in the trench and electrically connects the trench capacitor, a collar dielectric layer covers a portion of a sidewall of the trench overlying the trench capacitor, a top dielectric layer is disposed in the trench and on the conductive column, a gate structure is disposed on the substrate;

etching the substrate to form an opening between the collar dielectric layer and the gate structure;

implanting the substrate through the opening to form a doped region in a portion of the substrate below the opening for increasing partial threshold voltage of a parasitical transistor; and forming a transmissive strap by selective deposition, electrically connecting a drain of the gate structure and the conductive column.

2. The method for forming a memory device as claimed in claim 1, further comprising depositing and etching back an insulating layer to leave a sidewall portion on a sidewall of the opening before forming the transmissive strap.

3. The method for forming a memory device as claimed in claim 1, wherein the step of etching the substrate to form an opening uses a spacer of the gate structure and the top dielectric layer as a mask.

4. The method for forming a memory device as claimed in claim 3, wherein the etching has high selectivity between a material of the spacer and the top dielectric layer and another material of the substrate.

5. The method for forming a memory device as claimed in claim 4, wherein the etching method uses halide as main etchant.

6. The method for forming a memory device as claimed in claim 3, wherein the top dielectric layer, the collar dielectric layer and at least a portion of the spacer comprises silicon oxide.

7. The method for forming a memory device as claimed in claim 1, further comprising etching the top dielectric layer and the collar dielectric layer to expand the opening before forming the transmissive strap.

8. The method for forming a memory device as claimed in claim 1, wherein a portion of the collar dielectric layer neighboring the gate structure is thinner than other portions.

9. The method for forming a memory device as claimed in claim 8, wherein the portion of the collar dielectric layer neighboring the gate structure is substantially 10 Å-200 Å thick.

10. The method for forming a memory device as claimed in claim 2, wherein the insulating layer comprises silicon oxide.

11. The method for forming a memory device as claimed in claim 1, wherein the selective deposition is selective epitaxial growth (SEG).

12. A memory device, comprising:
a substrate;
a trench in the substrate;
a gate structure disposed on the substrate and neighboring the trench;
a trench capacitor disposed in a lower portion of the trench;
a conductive column disposed in the trench and electrically connecting the trench capacitor;
a collar dielectric layer covering a portion of a sidewall of the trench overlying the trench capacitor;
an opening in the substrate, and between the collar dielectric layer and the gate structure;
a doped region in a portion of the substrate below the opening for increasing partial threshold voltage of a parasitical transistor; and
a transmissive strap in the opening, electrically connecting a drain of the gate structure and the conductive column.

13. The memory device as claimed in claim 12, wherein the gate structure comprises two spacers on two opposite sidewalls, and one of the spacers neighboring the trench is thinner than the opposite spacer.

14. The memory device as claimed in claim 12, wherein the transmissive strap comprises doped polysilicon.

15. The memory device as claimed in claim 12, further comprising an insulating layer with a sidewall portion on a sidewall of the opening.

16. The memory device as claimed in claim 12, wherein the insulating layer comprises silicon oxide.

* * * * *